US007283802B2

(12) United States Patent
Kinouchi et al.

(10) Patent No.: US 7,283,802 B2
(45) Date of Patent: Oct. 16, 2007

(54) REMOTE CONTROL SYSTEM

(75) Inventors: Takashi Kinouchi, Tokyo (JP); Toshimi Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/523,022

(22) PCT Filed: Aug. 26, 2003

(86) PCT No.: PCT/JP03/10780

§ 371 (c)(1), (2), (4) Date: Feb. 2, 2005

(87) PCT Pub. No.: WO2004/021754

PCT Pub. Date: Mar. 11, 2004

(65) Prior Publication Data

US 2005/0275969 A1 Dec. 15, 2005

(30) Foreign Application Priority Data

Aug. 30, 2002 (JP) ............................ 2002-256230

(51) Int. Cl.
*H04B 1/06* (2006.01)
*H03G 3/00* (2006.01)

(52) U.S. Cl. ...................... 455/352; 455/348; 381/105; 345/169

(58) Field of Classification Search ................ 455/352, 455/351, 354, 355, 899, 344, 66.1, 569.1, 455/346, 575.1, 552.1; 345/169; 340/825.25; 381/105, 370, 374; 24/546, 115 G, 3.11, 24/3.12, 11 M, 499; 224/268, 699, 269, 224/272, 271
See application file for complete search history.

(56) References Cited

U.S. PATENT DOCUMENTS

| | | | | |
|---|---|---|---|---|
| 3,604,069 | A * | 9/1971 | Jensen | 24/115 G |
| 5,664,292 | A | 9/1997 | Chen | |
| 7,058,384 | B2 * | 6/2006 | Davies | 455/352 |
| 2002/0020045 | A1 * | 2/2002 | Nasu et al. | 24/546 |
| 2003/0153367 | A1 * | 8/2003 | Wu | 455/569.1 |
| 2004/0131220 | A1 * | 7/2004 | Liu | 381/375 |

FOREIGN PATENT DOCUMENTS

| | | |
|---|---|---|
| JP | 48754/1982 | 3/1982 |
| JP | 100384/1982 | 6/1982 |
| JP | 38895/1989 | 3/1989 |
| JP | 3054646 | 9/1998 |
| JP | 11-211756 | 8/1999 |
| JP | 11-253213 | 9/1999 |
| JP | 2000197174 A * | 7/2000 |
| JP | 2001-18565 | 1/2001 |
| JP | 2001-280314 | 10/2001 |
| JP | 2002-58089 | 2/2002 |
| JP | 2002058089 A * | 2/2002 |

* cited by examiner

*Primary Examiner*—Quochien B. Vuong
(74) *Attorney, Agent, or Firm*—Oblon, Spivak, McClelland, Maier & Neustadt, P.C.

(57) ABSTRACT

A remote control device is proposed, in which a clip for securing to clothing is removably disposed. The clip can be attached to the body of the remote control device such that the grip portion of the clip opens and closes either in the direction of a headphone side or a portable electronic equipment side.

3 Claims, 13 Drawing Sheets

IN CASE OF LEFT CHEST POCKET

IN CASE OF FLY PORTION(FOR MALE)

IN CASE OF FLY PORTION(FOR FEMALE)

REMOTE CONTROL SYSTEM

TECHNICAL FIELD

The present invention relates to a remote control device having a clip for securing to clothing, which is used for portable electronic equipment.

BACKGROUND ART

Traditionally, in portable electronic equipment such as portable mini disk (MD) players, portable compact disk (CD) players, there have been numerous ones that can be remotely controlled by a remote control device.

As such a remote control device, there is one disposed midway along a cord for electrically connecting portable electronic equipment and a headphone. In this remote control device, in the case of putting on a headphone, the weight of the remote control device may be applied to the ears, and in the case of carrying portable electronic equipment, the remote control device may be shaky. Therefore, as shown in FIG. 13, a remote control device 200 is provided with a clip 201, and the remote control device 200 is fixedly attached to clothing by gripping, for example, a chest pocket or a fly portion of the clothing by the clip 201.

In addition, the remote control device 200 is often provided with a liquid crystal display section 202, and by the liquid crystal display section 202, user can confirm, for example, an indication based on data in the reproduction state of the portable electronic equipment.

However, in a case where this conventional remote control device 200 is attached to, for example, a left chest pocket of clothing, a fly portion of female clothing (the right fly portion is on the upper side), or the like, there has been the problem that the characters on the liquid crystal display section 202 are illegible for user.

Herein, the above-mentioned problem is described specifically. As shown in FIG. 14, the direction of characters on the liquid crystal display section 202 is from the portable electronic equipment body side to the headphone side. Therefore, as shown in FIG. 15A, in a case where the remote control device 200 is attached to a left chest pocket of clothing with the use of the clip 201, when viewed from user, the characters on the liquid crystal display section 202 are directed from the right side to the left side, and the up-and-down direction of the characters is reversed, and hence the characters are illegible.

On the other hand, as shown in FIG. 15B, in a case where the remote control device 200 is attached to a male fly portion of clothing (the left fly portion is on the upper side) with the use of the clip 201, when viewed from user, the characters on the liquid crystal display section 202 are directed from the left side to the right side, and the up-and-down direction of the characters is not reversed, and hence the characters are legible.

However, as shown in FIG. 15C, in a case where the remote control device 200 is attached to a female fly portion of clothing (the right fly portion is on the upper side) with the use of the clip 201, when viewed from user, the characters on the liquid crystal display section 202 are directed from the right side to the left side, and the up-and-down direction of the characters is reversed, and hence the characters are illegible.

Further, depending on the type of the remote control device 200, the direction of characters is reversed from that in FIG. 14, and in some cases, the direction of characters on the liquid crystal display section 202 is from the headphone side to the portable electronic equipment body side, as shown in FIG. 16.

Even with the liquid crystal display section 202 on which indications are executed in such a direction of characters, it is unable to solve the problem that in the case of attaching the remote control device 200 to a male fly portion of clothing (the left fly portion is on the upper side) by using the clip 201, when viewed from user, the characters on the liquid crystal display section 202 are directed from the right side to the left side, and the up-and-down direction of the characters is reversed, and hence the characters are illegible.

Besides the above-mentioned problem relating to the legibility of characters in the liquid crystal display section 202, there has been the problem that the method of attaching the remote control device 200 to clothing with the use of the conventional clip 201 has limited the application of the remote control device 200, resulting in less degrees of freedom of the application of the remote control device 200. Specifically, for example, as shown in FIG. 17, the remote control device 200 cannot be attached to a pocket of clothing by using the clip 201, with the remote control device 200 upside down. It is therefore impossible to use with the remote control device 200 upside down.

Additionally, in a case where the clothing user is wearing does not have a pocket, a fly portion etc., to which the clip 202 is attached, for example, in a case where user is wearing a round-neck tee shirt having no pocket, as shown in FIG. 18, there has been the problem that the weights of the remote control device 200 and a cord 204 are applied to a driver section 203*a* of a headphone 203, thus hurting the ears.

The present invention was made in view of the foregoing problems, and has for its object to provide a remote control device in which a clip for securing to clothing is removably disposed.

DISCLOSURE OF THE INVENTION

A remote control device in accordance with the present invention is a remote control device, which is disposed midway along a cord for electrically connecting portable electronic equipment and a headphone, and remotely controls the portable electronic equipment, and has a display section for displaying character information outputted from the portable electronic equipment, and which is provided with a removable clip.

In the remote control device in accordance with the present invention, the removable clip is disposed in the remote control device, and hence when the clip is attached to the remote control device, the remote control device can be secured to clothing by gripping, for example, a pocket etc. of clothing by the attached clip. Also, when the clip is removed from the remote control device, the remote control device is easy to hold and easy to operate. Further, the removed clip can also be used to grip the cord.

Alternatively, a remote control device of the present invention is one to which a clip is attached such that a grip portion of the clip opens and closes either in the direction of a headphone side or a portable electronic equipment side.

Depending upon to which portion of clothing, such as a left chest pocket, female and male fly portions, etc. of clothing, the remote control device will be secured, the direction in which the grip portion of the clip opens and closes can be selected from the headphone side and the portable electronic equipment side so as to attach the clip to the remote control device. It is therefore able to secure the remote control device to the clothing in the direction in which character information on the display section is legible.

Alternatively, a remote control device of the present invention is one in which a clip has a first clip piece, a second clip piece, and a fixing lever that are rotatably supported on a rotary axis, and a spring disposed at the rotary axis, one end of which is supported on the first clip piece, and the other end is supported on the fixing lever, this spring having resilient bias to bias the fixing lever toward the second clip piece, and also having resilient bias in the direction in which a grip portion of the first clip piece and a grip portion of the second clip piece are press-contacted via the fixing lever, wherein a projection portion is formed at a bottom face of the second clip piece, and an engage projection is formed at the fixing lever, and there are disposed a slide groove over which the projection portion of the second clip piece slides, and two engage bores to which the engage projection of the fixing lever is engaged.

To attach the clip to the remote control device, while lifting the fixing lever of the clip, it is slid over the slide groove of the remote control device with the projection portion of the second clip piece as guide. Then, if the fixing lever is released, by the resilient bias of the spring that biases the fixing lever toward the second clip piece, the engage projection of the fixing lever is engaged to the engage bore of the remote control device, and the clip is attached to the remote control device.

To remove the clip from the remote control device, the fixing lever is lifted to release the engagement of the engage projection to the engage bore; and is slid to the slide groove of the remote control device in the opposite direction to that at the time of attachment, with the projection portion of the second clip piece as guide.

Alternatively, a stopper for restricting the slide of the projection portion of the second clip piece may be formed at the slide groove. Thereby, the slide of the clip may be executed until the projection portion is restricted by the stopper at the slide groove.

Alternatively, a remote control device of the present invention is adapted to grip a cord between the fixing lever of the removed clip and the second clip piece, and grip the clothing of user between the first clip piece and the second clip piece.

If the fixing lever of the removed clip is pushed up to grip the cord between the fixing lever and the second clip piece, and then the fixing lever is released, the cord is gripped by the resilient bias of the spring. Also, between the first clip piece and the second clip piece, part of the clothing of user is gripped by the resilient bias of the spring.

BEST MODE FOR CARRYING OUT THE INVENTION

An embodiment of the present invention will be described below in detail with reference to the drawings.

Figure 1A:
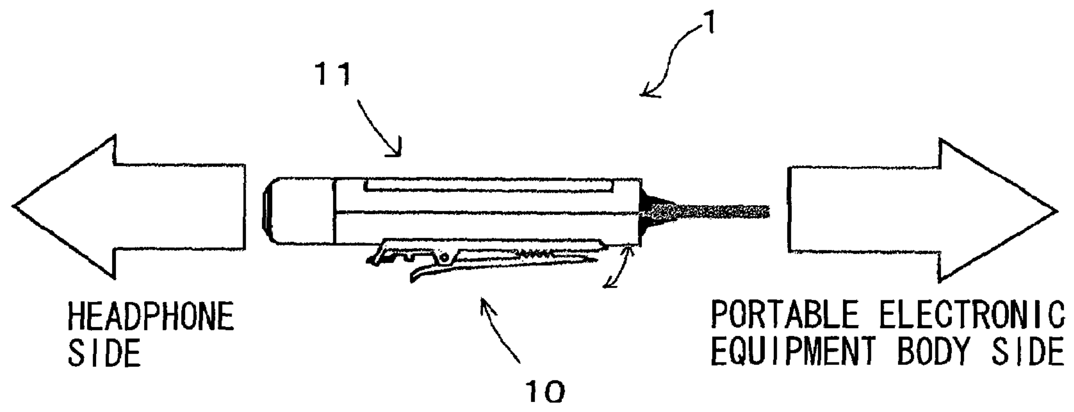
FIG. 1A and FIG. 1B are drawings showing a schematic construction of a remote control device that is an embodiment of the present invention.
Figure 1B:
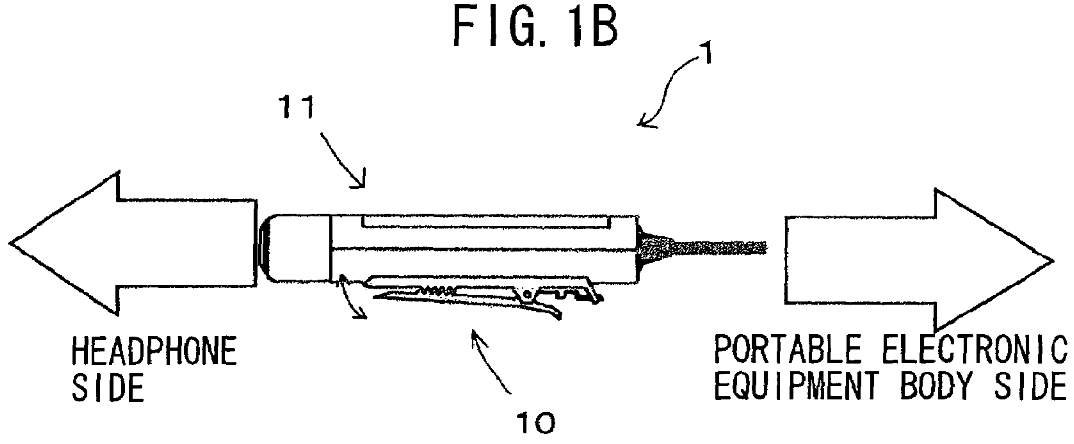

FIG. 1A and FIG. 1B show the construction of a remote control device in accordance with one embodiment of the present invention. This remote control device 1 is arranged such that a clip 10 is removably attachable to a remote control device body 11. Additionally, when the clip 10 is attached to the remote control device body 11, the direction of attachment of the clip 10 is changeable. FIG. 1A shows the remote control device 1 in which the clip 10 is attached to the remote control device body 11 in the direction in which a grip portion opens and closes to a portable electronic equipment body side; and FIG. 1B shows the remote control device 1 in which the clip 10 is attached to the remote control device body 11 in the direction in which the grip portion opens and closes to a headphone side by changing the direction 180 degrees with respect to that in FIG. 1A.

Figure 2A:
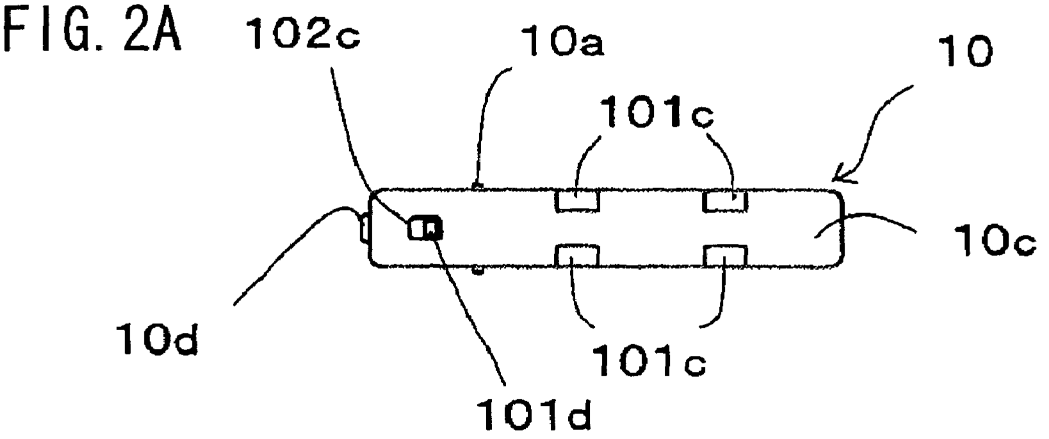
FIG. 2A, FIG. 2B, and FIG. 2C are drawings showing the construction of a clip in the remote control device shown in FIGS. 1A–1B.
Figure 2B:
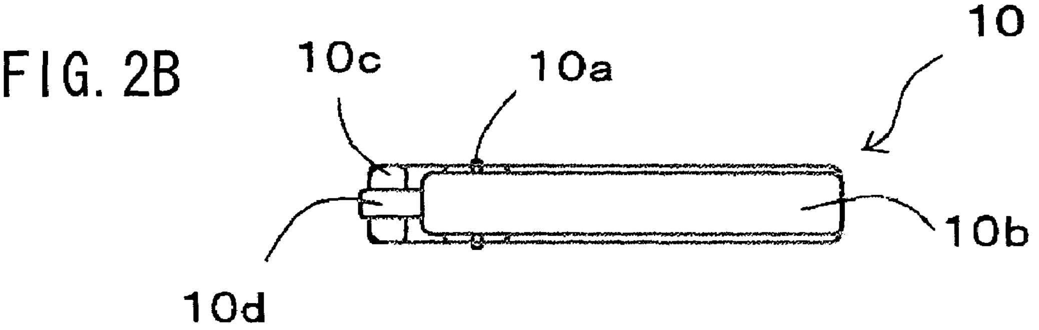
Figure 2C:
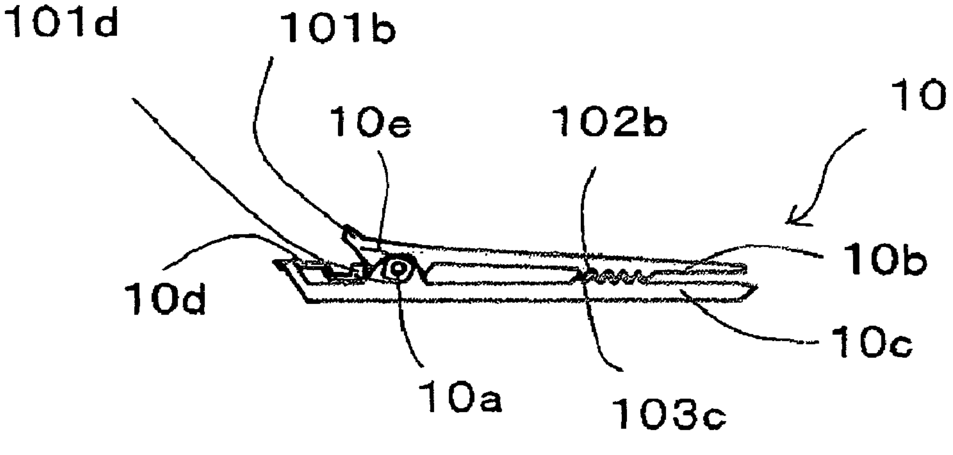
Figure 3A:
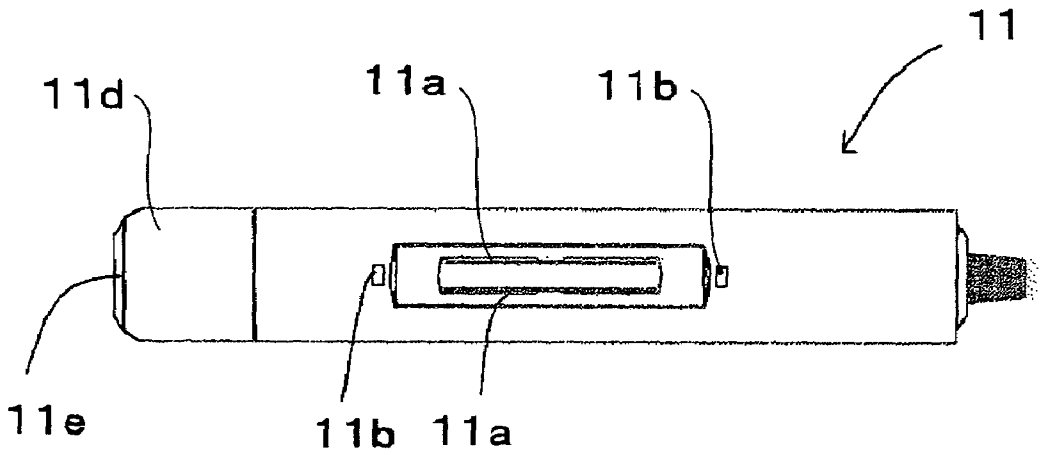
FIG. 3A and FIG. 3B are drawings showing the construction of a remote control device body in the remote control device shown in FIGS. 1A–1B.
Figure 3B:
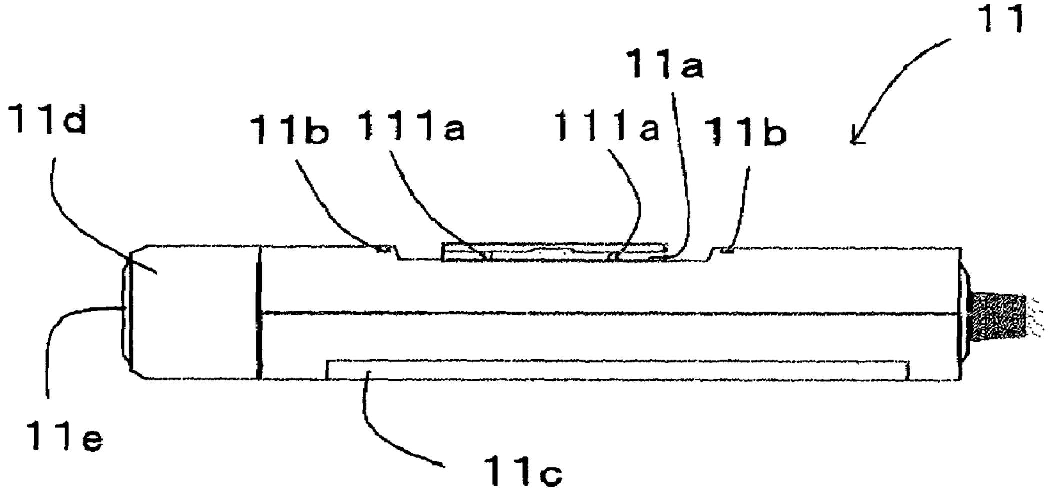

FIG. 2A, FIG. 2B, and FIG. 2C show the construction of the clip 10 alone; and FIG. 3A and FIG. 3B show the construction of the remote control device body 11 alone. The clip 10 is constructed by a pair of clip pieces 10*b*, 10*c*, and a fixing lever 10*d*, which are rotatably supported on a rotary axis 10*a*, and a spring 10*e* fit in the rotary axis 10*a*, one end of which is supported on the clip piece 10*b*, and the other end is supported on the fixing lever 10*d*.

Of the pair of clip pieces, the first clip piece 10*b* is provided with an operation portion 101*b* to be pushed down when opening the first clip piece 10*b*, and a grip portion 102*b* for gripping a chest pocket, a fly portion etc. of clothing. The grip portion 102*b* is formed in an uneven shape so as to be hard to slip off a pocket etc. of clothing.

In the second clip piece 10*c* of the other, four projection portions 101*c* and an opening 102*c* are formed in the bottom face thereof. Additionally, a grip portion 103*c* is formed at a position opposed to the grip portion 102*b* of the above-mentioned first clip piece 10*b*. When the clip 10 is used with removed from the remote control device body 11, one end of the second clip piece is also used as the operation portion.

In the fixing lever 10*d*, there is formed an engage projection 101*d* to be inserted into the opening 102*c* of the second clip piece 10*c* when attaching the clip 10 to the remote control device body 11.

The spring 10*e* is biased in the direction in which the fixing lever 10*d* is biased toward the second clip piece 10*c*, and also biased in the direction in which the grip portion 102*b* of the first clip piece 10*b* and the grip portion 103*c* of the second clip piece 10*c* are press-contacted via the fixing lever 10*d*. For example, a torsion coil spring is used as the spring 10*e*. Alternatively, for example, a plate spring etc. may be used as the spring 10*e*.

The remote control device body 11 is in a stick shape, for example, and a slide groove 11*a* and an engage bore 11*b* for attaching the clip 10 are formed in the rear side of the remote control device body 11. In addition, the remote control device body 11 is provided with a liquid crystal display section 11*c* for displaying character information outputted from the portable electronic equipment body, an operation key 11*d*, and a headphone jack 11*e*.

The slide groove 11*a* is to slide the projection portion 101*c* of the second clip piece 10*c* when attaching the clip 10 to the remote control device body 11. A stopper 111*a* for restricting slide action of the projection portion 101*c* is formed midway along the slide groove 11*a*.

The engage bore 11*b* is to engage the engage projection 101*d* of the fixing lever 10*d* when attaching the clip 10 to the remote control body 11. Two engage bores 11*b* are formed in the rear side of the remote control device body 11, and the engage bore 11*b*, to which the engage projection 101*d* of the fixing lever 10*d* is engaged, is selected depending on the direction of attachment of the clip 10.

A method of attaching the clip 10 to the remote control device body 11 will next be described by using FIGS. 4A–4H. Herein, there will be described the case of attaching the clip 10 to the remote control device body 11 in the direction in which the grip portions 102*b* and 103*c* open and close to the portable electronic equipment body side.

Figures 4A, 4B, 4C, 4D, 4E, 4F, 4G, 4H:
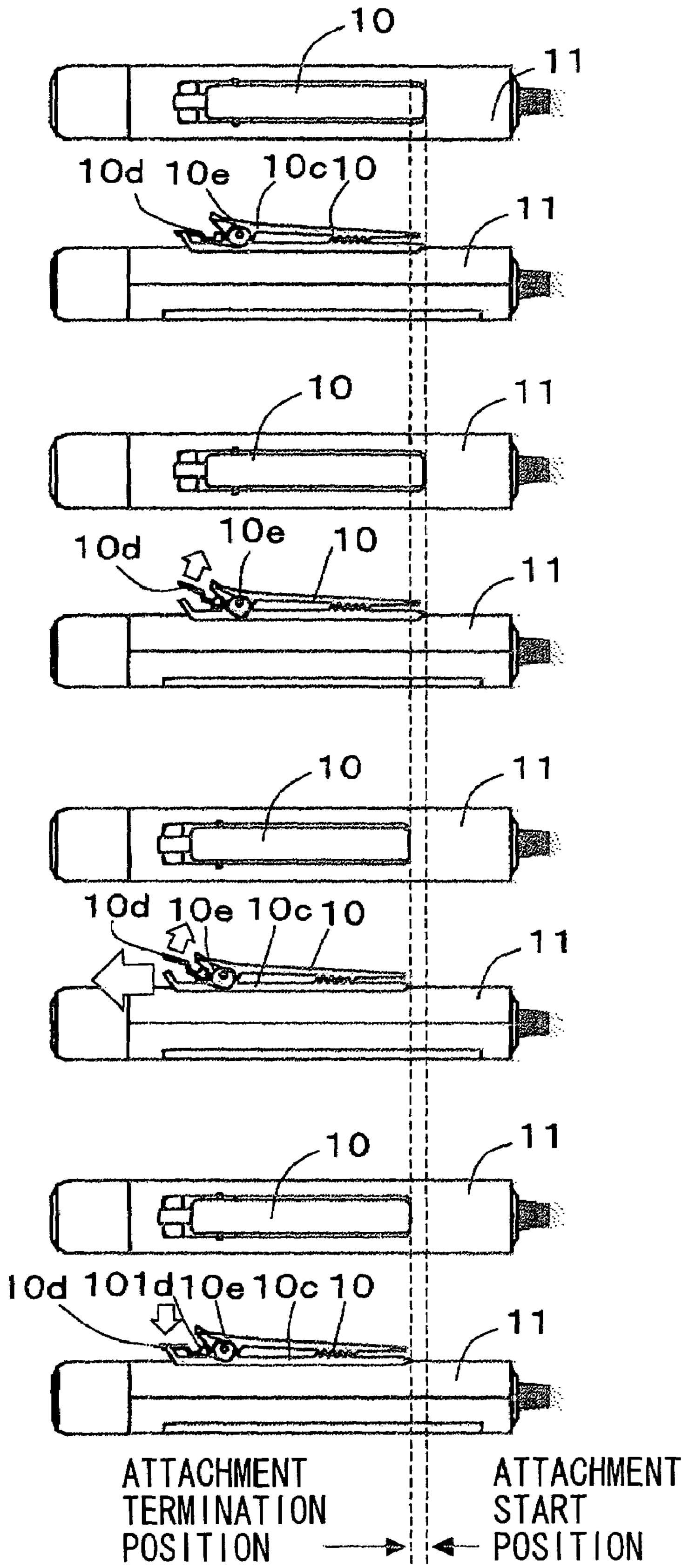
FIGS. 4A–4H are explanatory drawings to explain a method of attaching a clip that is an embodiment of the present invention to a remote control device body.

First, as shown in FIGS. 4A and 4B, the positioning of the clip 10 is accomplished so as to have such a position that the projection portion 101*c* of the second clip piece 10*c* of the clip 10 makes contact with the slide groove 11*a* of the remote control device body 11.

Subsequently, as shown in FIGS. 4C and 4D, the fixing lever 10*d* of the clip 10 is lifted in a direction away from the remote control device body 11.

Subsequently, as shown in FIGS. 4E and 4F, with the fixing lever 10*d* of the clip 10 held lifted, the clip 10 is slid leftward as seen in FIG. 4F, over the slide groove 11*a* of the remote control device body 11 with the projection portion 101*c* of the second clip piece 10*c* as guide. This slide of the clip 10 is executed until the projection portion 101*c* of the second clip piece 10*c* is restricted by the stopper 11*a* of the slide groove 11*a*.

Subsequently, as shown in FIGS. 4G and 4H, if the fixing lever 10*d* of the clip 10 is released, by the resilient bias of the spring 10*e*, the fixing lever 10*d* is rotated with the rotary axis 10*a* as spindle, so that the engage projection 101*d* of the fixing lever 10*d* is engaged to the engage bore 1*b* of the remote control device body 11.

Thus, the clip 10 is fixedly secured to the remote control device body 11. In the case of attaching the clip 10 to the remote control device body 11 in the direction in which the grip portions 102*b* and 103*c* open and close to the headphone side, the direction in which the clip 10 is slid, and the like may be executed in the opposite left-right direction of that in FIGS. 4A–4H.

A method of removing the clip 10 from the remote control device body 11 will next be described by using FIGS. 5A–5F. Herein, there will be described the case of attaching the clip 10 to the remote control device body 11 in the direction in which the grip portions 102*b* and 103*c* open and close to the portable electronic equipment body side.

Figures 5A, 5B, 5C, 5D, 5E, 5F:
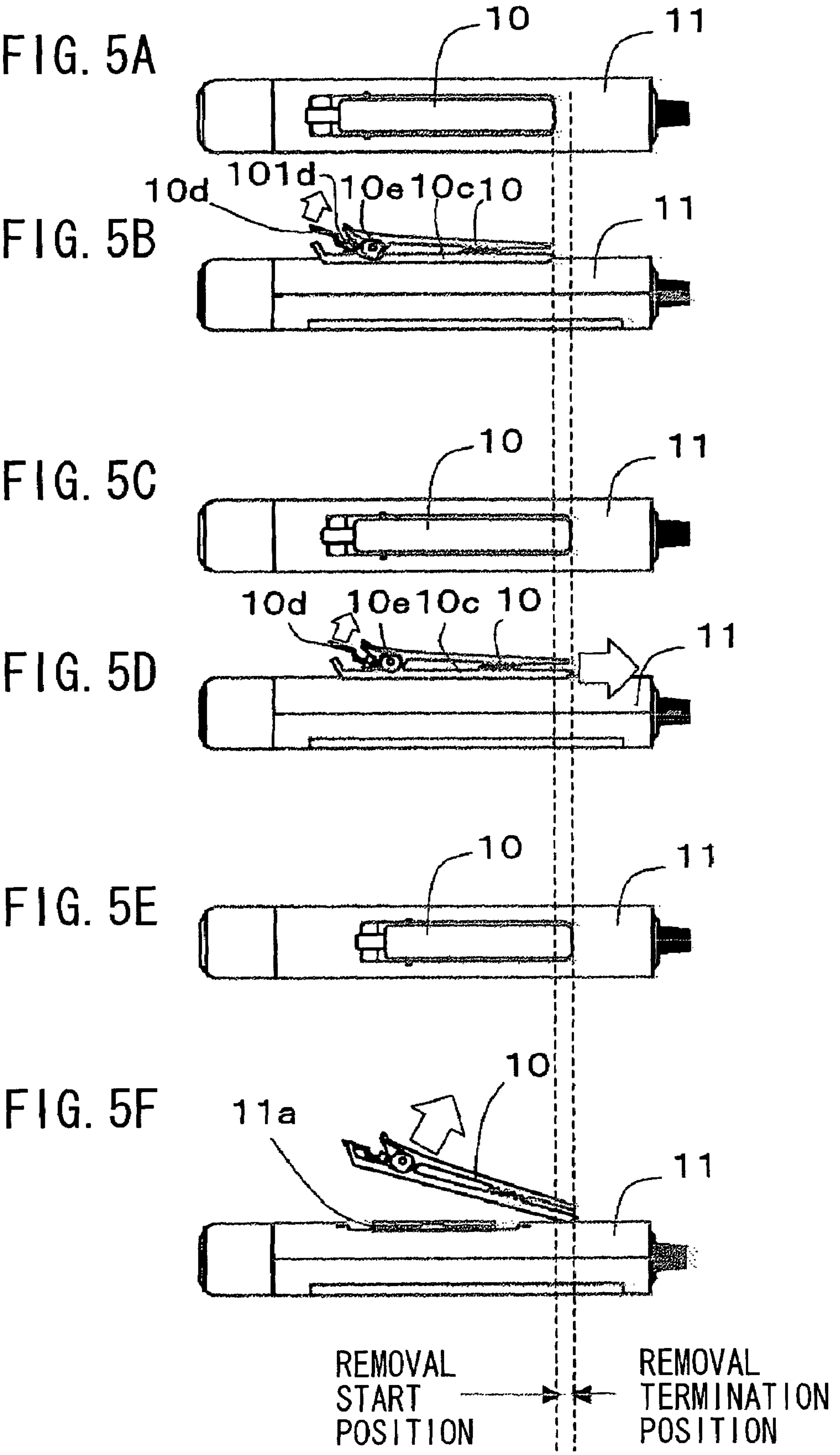
FIGS. 5A–5F are explanatory drawings to explain a method of removing the clip that is an embodiment of the present invention from the remote control device body.

First, as shown in FIGS. 5A and 5B, the fixing lever 10*d* of the clip 10 is lifted to release the engage projection 101*d* of the fixing lever 10*d* from the engage bore 11*b* of the remote control device body 11.

Subsequently, as shown in FIGS. 5C and 5D, with the fixing lever 10*d* of the clip 10 held lifted, the clip 10 is slid rightward as seen in FIG. 4D, over the slide groove 11*a* of the remote control device body 11 with the projection portion 101*c* of the second clip piece 10*c* as guide.

Subsequently, as shown in FIGS. 5E and 5F, the clip 10 is lifted such that the clip 10 is removed from the remote control device body 11. In the case of removing the clip 10 when the clip 10 is attached to the remote control device body 11 in the direction in which the grip portions 102*b* and 103*c* open and close to the headphone side, the direction in which the clip 10 is slid, and the like may be executed in the opposite left-right direction of that in FIGS. 5A–5F.

A method of securing the remote control device 1 to clothing by gripping a chest pocket or a fly portion of the clothing by the clip 10 of this remote control device 1 will next be described. First, the operation portion 101*b* of the first clip piece 10*b* is pushed down to open the grip portions 102*b* and 103*c*, and grip a chest pocket edge etc. of the clothing between the grip portions 102*b* and 103*c*. Then, if the operation portion 101*b* of the first clip piece 10*b* is released, by the resilient bias of the spring 10*e*, the chest pocket edge etc. of the clothing is gripped between the grip portions 102*b* and 103*c*, and the grip portions 102*b* and 103*c* are closed, thereby enabling to secure the remote control device 1 to the clothing by the clip 10.

Figure 6:
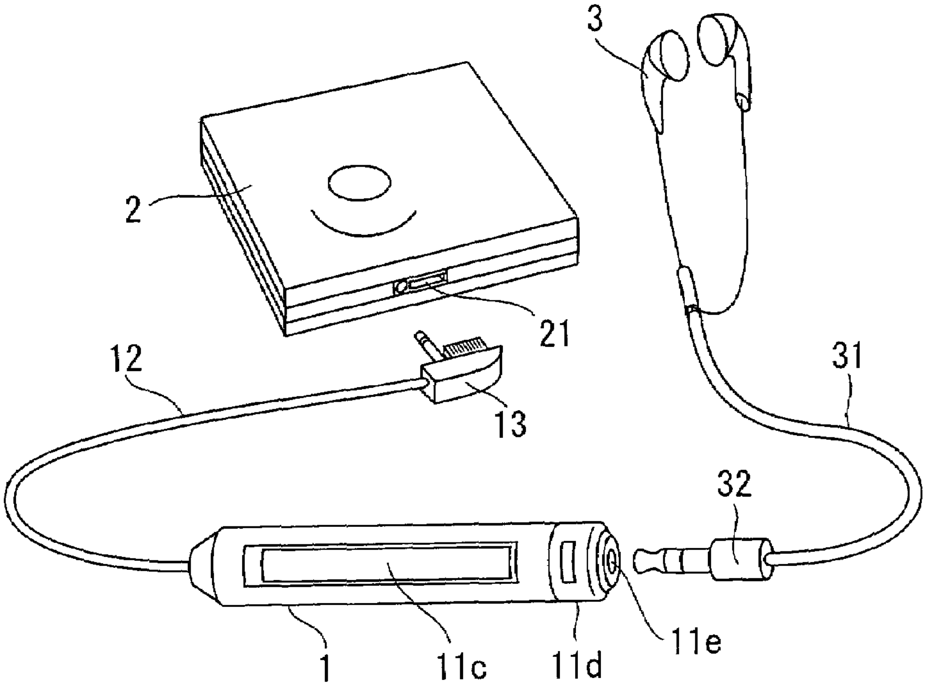
FIG. 6 is a drawing showing one construction example of portable electronic equipment provided with a remote control device that is an embodiment of the present invention.

FIG. 6 shows one construction example of portable electronic equipment having this remote control device 1. The remote control device 1 and a headphone 3 are electrically connected by inserting a headphone plug 32 disposed at the tip of a headphone cord 31 of the headphone 3 into a headphone jack 11*e* of the remote control device 1. Then, the remote control device 1 and a portable electronic equipment body 2 are electrically connected by inserting a remote control plug 13 disposed at the tip of a remote control cord 12 into a remote control jack 21 of the portable electronic equipment body 2. In other words, the remote control device 1 is disposed midway along the cord for electrically connecting the portable electronic equipment body 2 and the headphone 3.

For example, audio information reproduced in the portable electronic equipment body 2 is listened by the headphone 3. In this occasion, the control of the portable electronic equipment body 2 can be made by the operation of the operation key 11*d* disposed at the remote control device 1.

For example, when the portable electronic equipment is an MD player, indications (e.g., indications such as track number, reproduction time, disk name, title name, title number, and reproduction state) based on data in its reproduction state, for example, can be confirmed by the liquid crystal display section 11*c* of the remote control device 1 secured to clothing by the clip 10. Thus, the remote control of the portable electronic equipment is executable by the remote control device 1.

Thus in the remote control device of this embodiment, to execute attachment and removal of the clip 10 with respect to the remote control device body 11, it may be slid over the slide groove 11*a* of the remote control device body 11 with the projection portion 101*c* of the second clip piece 10*c* of the clip 10 as guide, thereby facilitating the attachment and the removal of the clip 10 with respect to the remote control device body 11. Additionally, in the remote control device of this embodiment, the slide of the clip 10 may be executed until the projection portion 101*c* of the second clip piece 10*c* is restricted by the stopper 111*a* of the slide groove 11*a*, and hence the position of attachment of the clip 10 to the remote control device body 11 can be positioned easily.

Further, since in the remote control device of this embodiment it is arranged such that the clip 10 is secured to the remote control device body 11 by having the engage projection 101*d* of the fixing lever 10*d* of the clip 10 engage to the engage bore 11*b* of the remote control device body 11 by the resilient bias of the spring 10*e*, even if the clip 10 is removable to the remote control device body 11, the clip 10 is firmly secured to the remote control device body 11.

Furthermore, since in the remote control device of this embodiment it is arranged to use the spring 10*e* for both purposes of closing the clip 10 for gripping clothing, and securing the clip 10 to the remote control device body 11, there is no need to use additional springs, thereby minimizing cost increase.

Additionally, since in the remote control device of this embodiment the direction of attachment of the clip 10 is changeable when attaching the clip 10 to the remote control device body 11, even when attaching the clip 10 to a left chest pocket of clothing, or even when attaching the clip 10 to a fly portion regardless of female and male, the characters on the liquid crystal display section 11*c* of the remote control device 1 are legible thereby to improve the operability of remote control of the portable electronic equipment by means of the remote control device 1. There will be specifically described by using FIG. 7, and FIG. 8A, FIG. 8B, and FIG. 8C.

Figure 7:
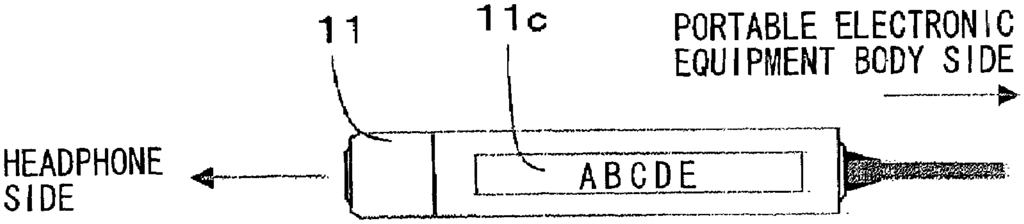
FIG. 7 is an explanatory drawing to explain the direction of characters on a liquid crystal display section of a remote control device that is an embodiment of the present invention.
Figure 8A:
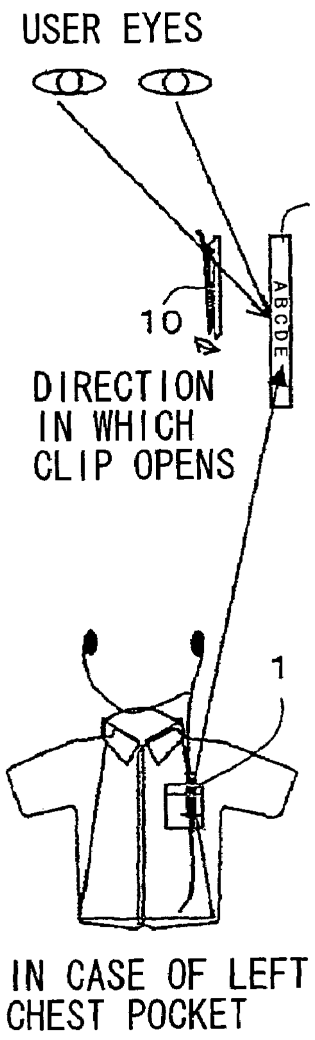
FIG. 8A, FIG. 8B, and FIG. 8C are explanatory drawings to explain a method of attaching a remote control device that is an embodiment of the present invention to various portions of clothing, and how characters on a liquid crystal display section are seen by user.

As shown in FIG. 7, it is assumed that the direction of characters on the liquid crystal display section 11*c* is from the headphone side to the portable electronic equipment body side. As shown in FIG. 8A, when the remote control device 1 is attached to a left chest pocket of clothing by using the clip 10, if attached in the direction in which the grip portions 102*b* and 103*c* of the clip 10 open and close to the portable electronic equipment body side, characters are directed from the left side to the right side as seen from user, and hence the characters on the liquid crystal display section 11*c* are legible.

Figure 8B:
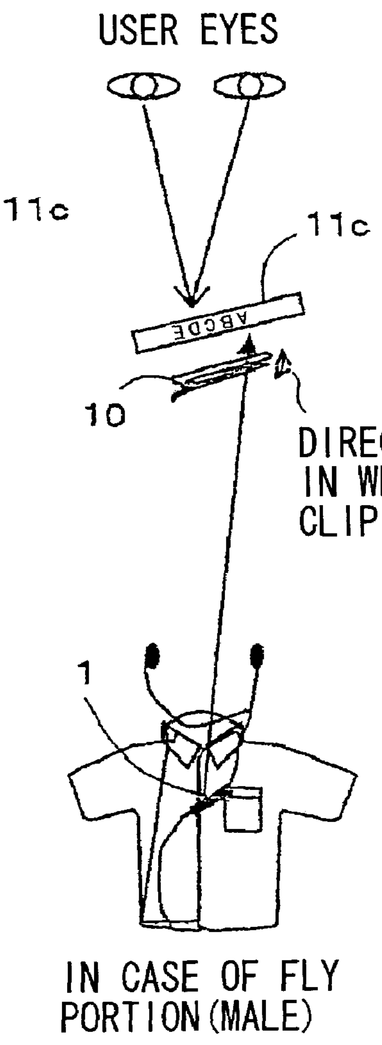

Alternatively, as shown in FIG. 8B, when the remote control device 1 is attached to a male fly portion of clothing (the fly portion is on the left side) by using the clip 10, if attached in the direction in which the grip portions 102*b* and 103*c* of the clip 10 open and close to the headphone side, characters are directed from the left side to the right side as seen from user, and hence the characters on the liquid crystal display section 11*c* are legible.

Figure 8C:
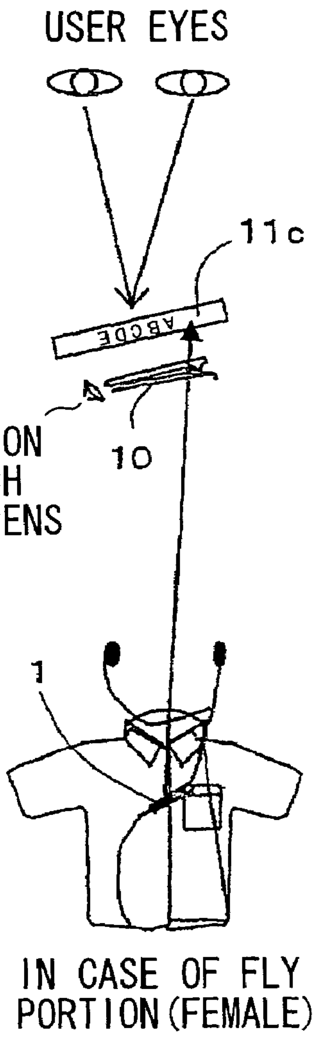

Alternatively, as shown in FIG. 8C, when the remote control device 1 is attached to a female fly portion of clothing (the fly portion is on the right side) by using the clip 10, if attached in the direction in which the grip portions 102*b* and 103*c* of the clip 10 open and close to the portable electronic equipment side, characters are directed from the left side to the right side as seen from user, and hence the characters on the liquid crystal display section 11*c* are legible.

Figure 9:
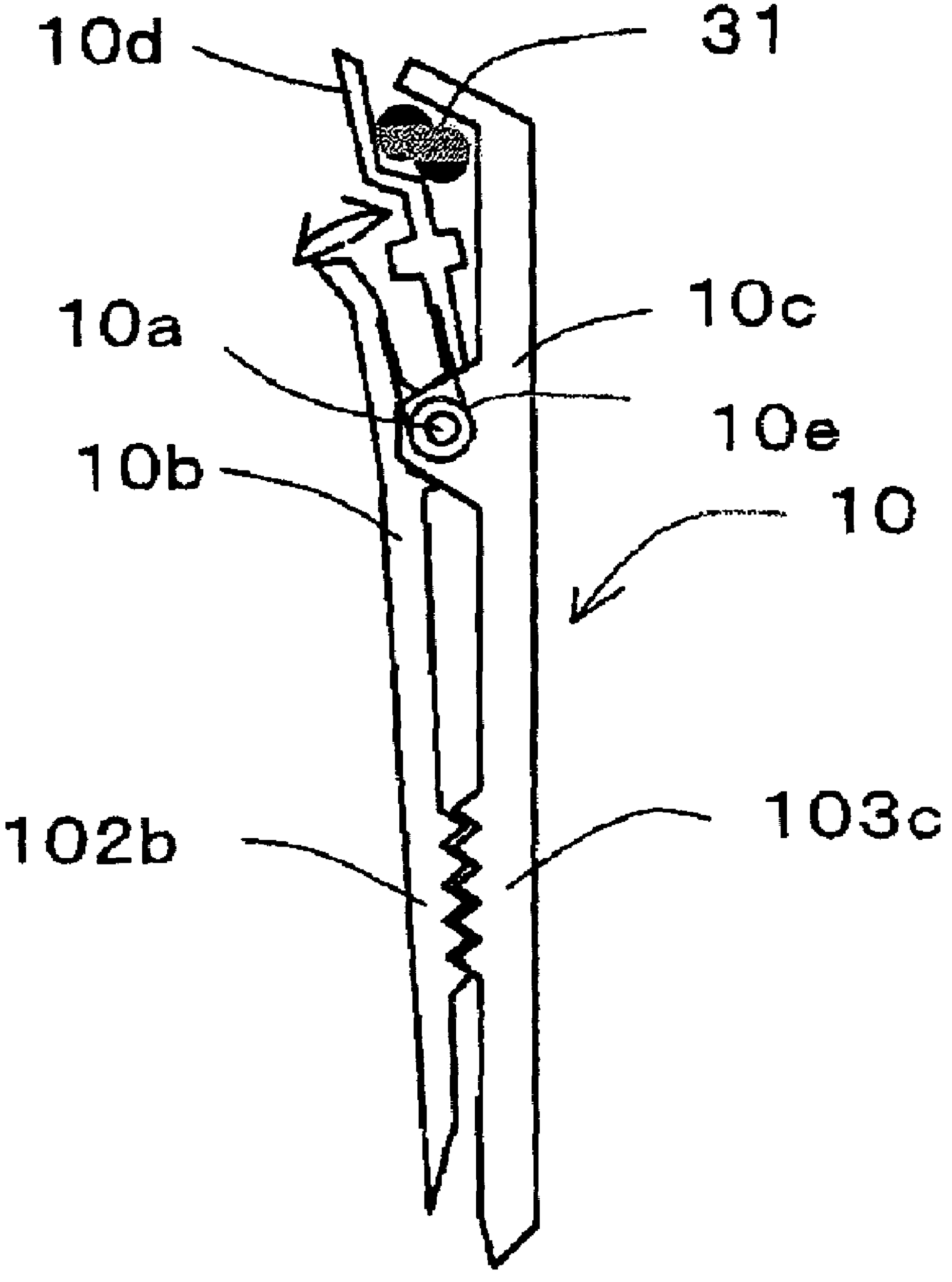
FIG. 9 is an explanatory drawing to explain gripping of a remote control cord by a removed clip that is an embodiment of the present invention.
Figure 10:
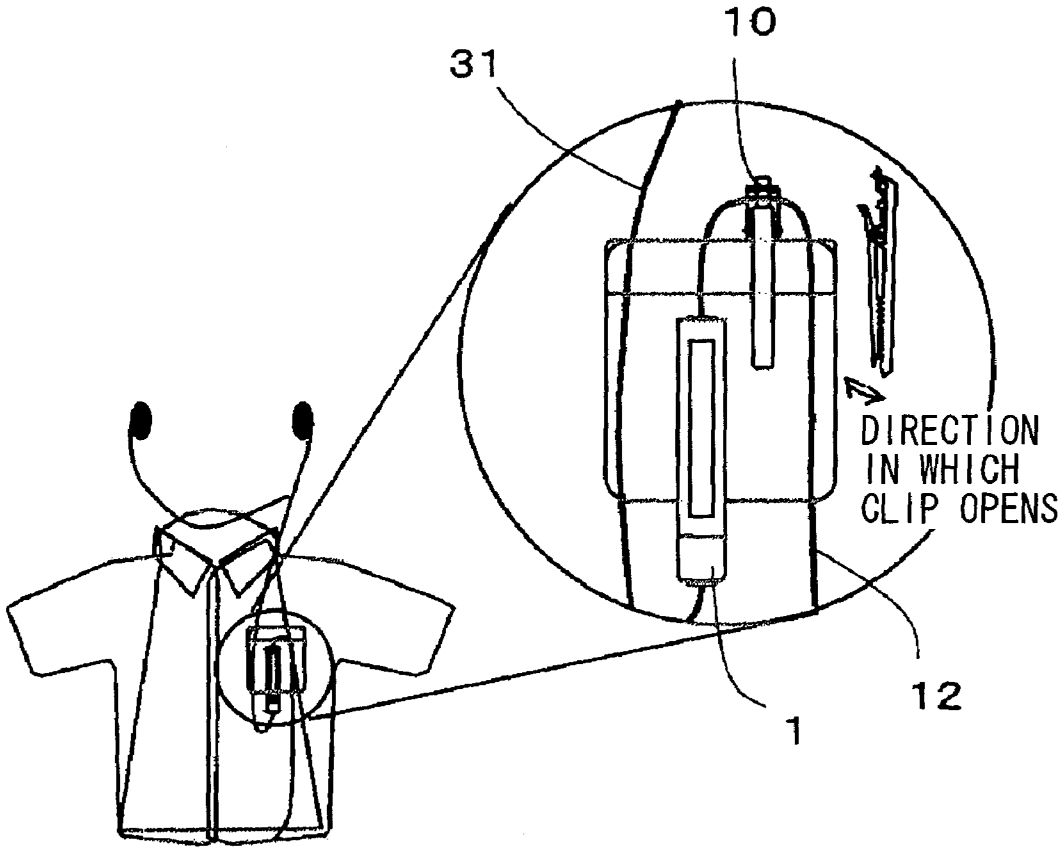
FIG. 10 is an explanatory drawing to explain the application in which a remote control device is turned upside down by using a removed clip that is an embodiment of the present invention.

Further, since in the remote control device of this embodiment it is arranged such that the clip 10 is removable from the remote control device body 11, the degree of freedom of the application of the remote control device 1 is improved by utilizing the removed clip 10. For example, as shown in FIG. 9 and FIG. 10, the fixing lever 10*d* of the clip 10 removed from the remote control device body 11 is pushed up, and the remote control cord 12 in the vicinity of the remote control device body 11 is gripped between the fixing lever 10*d* and the second clip piece 10*c*. If the fixing lever 10*d* is then released, the remote control code 12 is gripped and secured between the fixing lever 10*d* and the second clip piece 10*c* by the resilient bias of the spring 10*e*.

Between the grip portions 102*b* and 103*c* of the clip 10, for example, the edge of a left chest pocket of clothing is gripped to secure the clip 10 to the left chest pocket of the clothing. By so doing, the remote control cord 12 connected to the remote control device body 11 can be supported so as to extend downwardly in the vicinity of the remote control device body 11. Accordingly, the remote control device body 11 can be held upside down, thereby improving the degree of freedom of the application of the remote control device 1.

Figure 11:
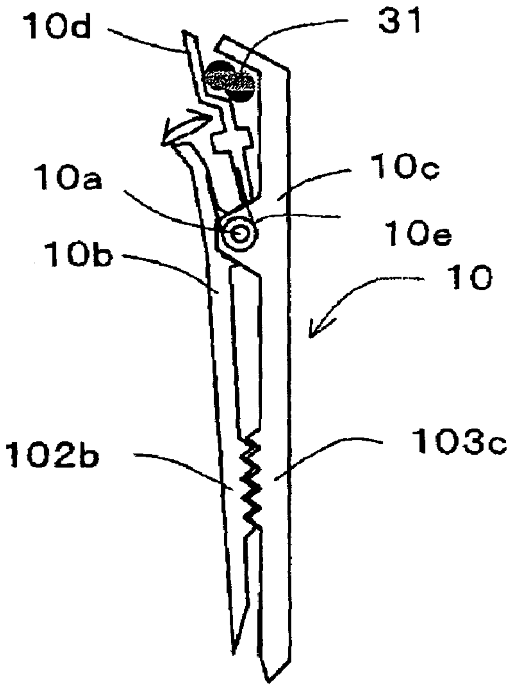
FIG. 11 is an explanatory drawing to explain gripping of a headphone cord by a removed clip that is an embodiment of the present invention.
Figure 12:
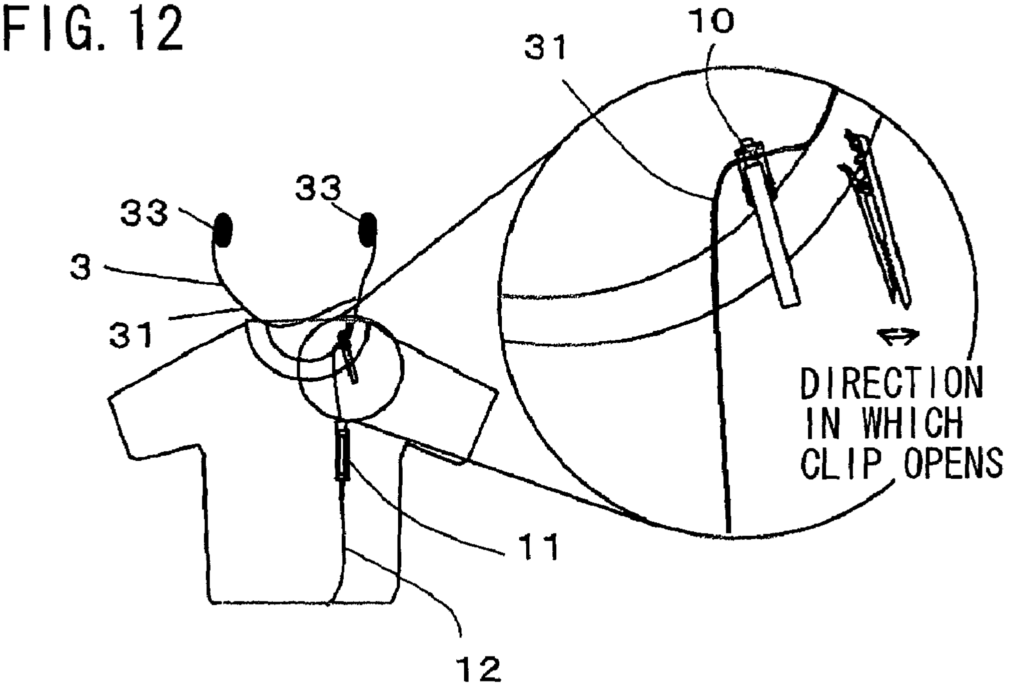
FIG. 12 is an explanatory drawing to explain a method of distributing the weights of a remote control device body and a remote control cord by using a removed clip that is an embodiment of the present invention.
Figure 13:
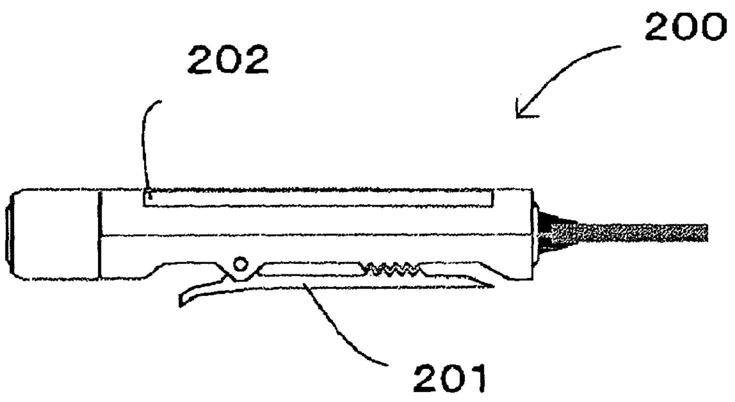
FIG. 13 is a drawing showing a schematic construction of a conventional remote control device.
Figure 14:
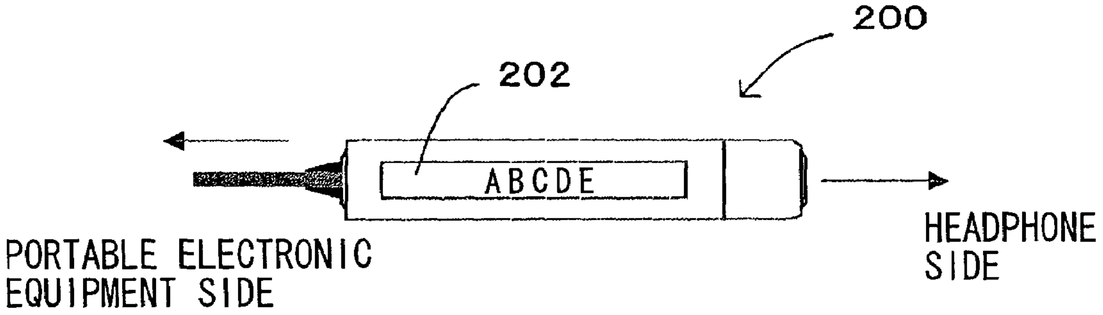
FIG. 14 is an explanatory drawing to explain the direction of characters on a liquid crystal display section of a conventional remote control device.
Figure 15A:
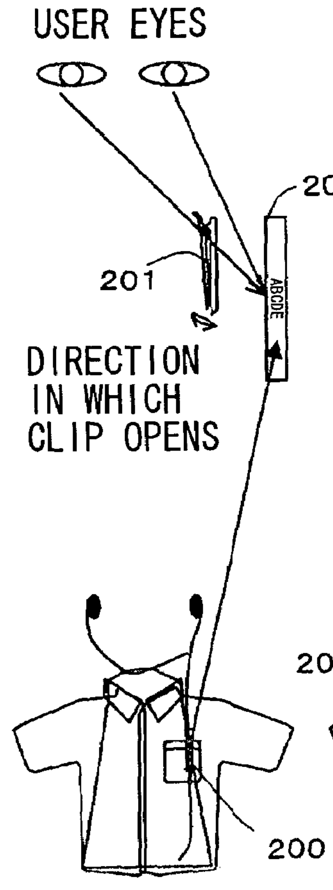
FIG. 15A, FIG. 15B, and FIG. 15C are explanatory drawings to explain a method of attaching a conventional remote control device to various portions of clothing, and how characters on a liquid crystal display section are seen by user.
Figure 15B:
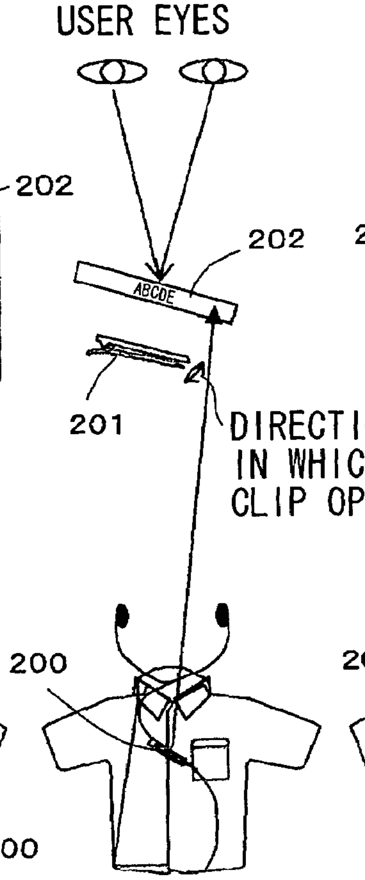
Figure 15C:
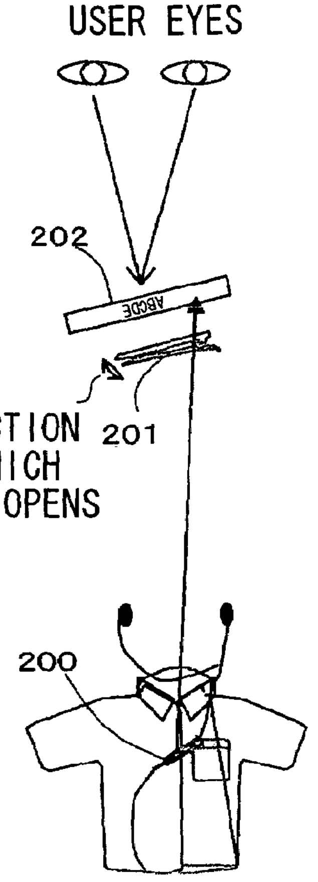
Figure 16:
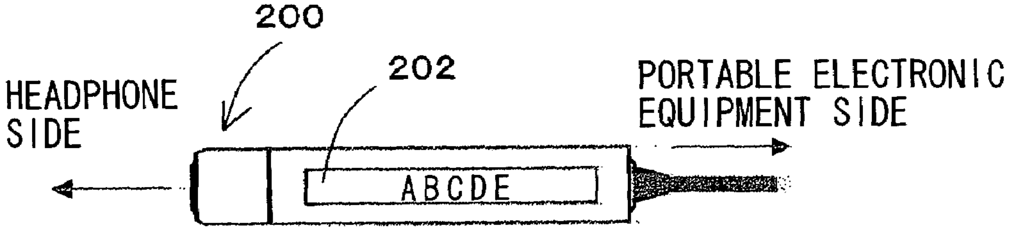
FIG. 16 is an explanatory drawing to explain the direction of characters opposite to that in FIG. 14, on the liquid crystal display section of the conventional remote control device.
Figure 17:
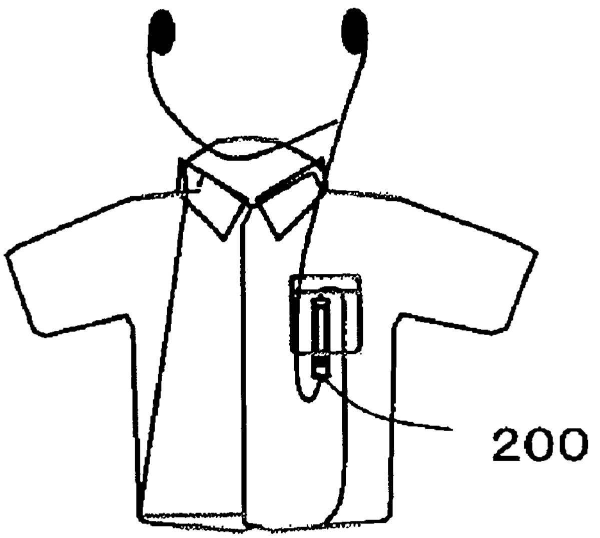
FIG. 17 is an explanatory drawing to explain a case where a remote control device is used by turning it upside down.
Figure 18:
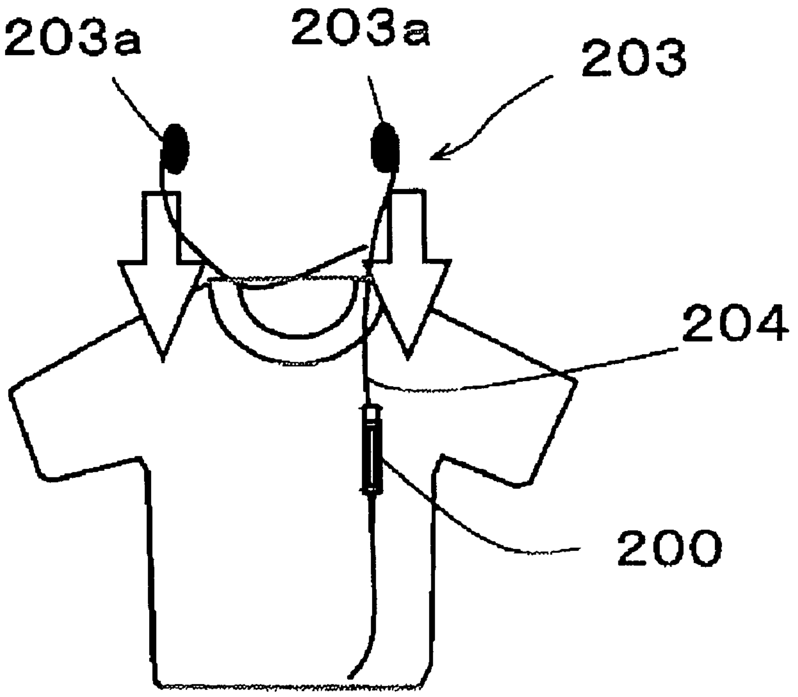
FIG. 18 is an explanatory drawing in a case where user wears clothing to which a conventional remote control device cannot be secured.

Furthermore, since in the remote control device of this embodiment it is arranged such that the clip 1 is removable from the remote control device body 11, even when the clothing of user is, for example, a round-neck tee shirt having no pocket, which is clothing that cannot secure the remote control device 1 by the clip 10, the use of the removed clip 10 eliminates that the weights of the remote control device body 11 etc. are applied to a driver section 33 of the headphone 3, and it is able to prevent hurting the ears to which the headphone 3 is attached. For example, as shown in FIG. 11 and FIG. 12, the fixing lever 10*d* of the clip 10 removed from the remote control device body 11 is pushed up, and the headphone cord 31 is gripped between the fixing lever 10*d* and the second clip piece 10*c*. If the fixing lever 10*d* is then released, the headphone cord 31 is gripped and secured between the fixing lever 10*d* and the second clip piece 10*c* by the resilient bias of the spring 10*e*.

For example, between the grip portions 102*b* and 103*c* of the clip 10, the round-neck collar of a tee shirt is gripped so as to secure the clip 10 to the round-neck collar of the tee shirt. By so doing, the weights of the remote control device body 11 and the remote control cord 12 are applied to the clip 10 secured to the round-neck collar of the tee shirt, so that only part of the weights of the headphone 3 and the headphone cord 31 is applied to the driver section 33 of the headphone 3, thereby distributing the weights of the remote control device body 11, etc. This prevents hurting the ears to which the headphone 3 is attached.

Additionally, since in the remote control device of this embodiment it is arranged such that the clip 10 is removable from the remote control device body 11, for user who does not use the clip 10, the remote control device 1 with the clip 10 removed is easy to hold, thereby facilitating operation and also presenting neat in design.

While the present invention is described by referring to the embodiment, the present invention should not be limited to the foregoing embodiment, and various modifications are possible.

For example, the present invention is also applicable to portable electronic equipment such as portable telephones, personal digital assistances (PDAs), notebook computers, transceivers, besides portable sound equipment such as portable MD players, and portable CD players.

While the remote control device in which the headphone is electrically connected has been described in the foregoing embodiment, this headphone is taken to include an earphone and an earphone mike.

INDUSTRIAL APPLICABILITY

As described above, in accordance with a remote control device as set forth in claim 1, it is arranged to dispose a removable clip in the remote control device. Therefore, when attaching the clip to the remote control device, the remote control device can be secured to clothing, and when removing the clip from the remote control device, the remote control device is easy to hold and easy to operate. Additionally, the removed clip can be used to grip a cord.

Alternatively, in accordance with a remote control device as set forth in any one of claim 2 to claim 4, it is arranged such that the direction of attachment of a clip is variable. Therefore, by using the clip, the direction of attachment of which is selected, the remote control device can be secured to clothing in the direction in which character information on the display section is legible.

Further, in accordance with a remote control device as set forth in claim 5, it is arranged such that a cord and clothing can be gripped with the removed clip. It is therefore able to improve, for example, the degree of freedom of the application of the remote control device, and support the weight of the remote control device by the clip.

The invention claimed is:

1. A remote control device being disposed midway along a cord for electrically connecting a portable electronic equipment and a headphone, and remotely controlling said portable electronic equipment, and having a display section for displaying character information outputted from said portable electronic equipment, said remote control device comprising:

a removable clip, said removable clip is able to be attached to said remote control device such that a grip portion of said clip opens and closes in the direction of said headphone side or said portable electronic equipment side, said removable clip having a first clip piece, a second clip piece, and a fixing lever that are rotatably supported on a rotary axis, and a spring disposed at said rotary axis, one end of which is supported on said first clip piece, and the other end is supported on said fixing lever, said spring having resilient bias to bias said fixing lever toward said second clip piece, and also having resilient bias in the direction in which a grip portion of said first clip piece and a grip portion of said second clip piece are press-contacted via said fixing lever, wherein a projection portion is formed at a bottom face of said second clip piece, and an engage projection is formed at said fixing lever, and on a body of said remote control device, there are disposed a slide groove over which said projection portion of said second clip piece slides, and two engage bores to which said engage projection of said fixing lever is engaged.

2. The remote control device as described in claim 1, further comprising:

a stopper, for restricting said slide of said projection portion of said second clip piece, formed at said slide groove.

3. The remote control device as described in claim 1, wherein said remote control device is adapted to grip said cord between said fixing lever of said removable clip and said second clip piece, and grip the clothing of a user between said first clip piece and said second clip piece.

* * * * *

UNITED STATES PATENT AND TRADEMARK OFFICE

CERTIFICATE OF CORRECTION

PATENT NO. : 7,283,802 B2
APPLICATION NO. : 10/523022
DATED : October 16, 2007
INVENTOR(S) : Takashi Kinouchi et al.

It is certified that error appears in the above-identified patent and that said Letters Patent is hereby corrected as shown below:

Column 6, line 10, change "11a" to --111a--.

Column 6, line 16, change "1b" to --11b--.

Column 8, line 32, change "code" to --cord--.

Column 9, line 27, delete "in accordance with",
line 28, delete "as set forth in claim 1, it",
line 35, delete "in accordance with",
line 36, delete "as set forth in any one of claim 2 to claim 4, it",
line 42, delete "in accordance with",
lines 42-43, delete "as set forth in claim 5, it".

Signed and Sealed this

Seventeenth Day of June, 2008

JON W. DUDAS
*Director of the United States Patent and Trademark Office*